United States Patent [19]

Egawa

[11] Patent Number: 6,066,886
[45] Date of Patent: May 23, 2000

[54] SEMICONDUCTOR WAFER IN WHICH REDUNDANT MEMORY PORTION IS SHARED BY TWO NEIGHBORING SEMICONDUCTOR MEMORY PORTIONS AND IS CONNECTED TO THE SEMICONDUCTOR MEMORY PORTIONS

[75] Inventor: Yuichi Egawa, Tokyo, Japan

[73] Assignee: United Microelectronics, Hsinchu, Taiwan

[21] Appl. No.: 08/958,486

[22] Filed: Oct. 27, 1997

[30] Foreign Application Priority Data

Oct. 29, 1996 [JP] Japan .................................. 8-303732

[51] Int. Cl.$^7$ ................................................ H01L 23/544

[52] U.S. Cl. ........................................... 257/620; 365/200

[58] Field of Search .............................. 257/620; 365/200, 365/201, 230.01, 51

[56] References Cited

U.S. PATENT DOCUMENTS 5,523,975  6/1996  Reddy ...................................... 365/200
5,532,966  7/1996  Poteet et al. ............................. 365/200

*Primary Examiner*—Sara Crane
*Attorney, Agent, or Firm*—Pollock, Vande Sande & Amernick

[57] ABSTRACT

Redundant memory portions having redundant memory cells for relieving malfunctioning normal memory cells are arranged among the semiconductor memory portions that neighbor each other in the row direction and in the column direction on a semiconductor wafer on which a plurality of semiconductor memory portions are arranged in the form of a matrix. Cutting lines are formed between the redundant memory portions and the neighboring semiconductor memory portions, so that the semiconductor wafer can be separated into semiconductor memory devices (chips) in a subsequent stage in a manner in which the redundant memory portions are connected to the semiconductor memory portion as required. This embodiment makes it possible to decrease the chip size and to efficiently substitute the redundant memory cell array for the defective lines.

39 Claims, 5 Drawing Sheets

SEMICONDUCTOR WAFER IN WHICH REDUNDANT MEMORY PORTION IS SHARED BY TWO NEIGHBORING SEMICONDUCTOR MEMORY PORTIONS AND IS CONNECTED TO THE SEMICONDUCTOR MEMORY PORTIONS

BACKGROUND OF THE INVENTION

1. Field of the Invention

The present invention relates to a semiconductor wafer in which normal semiconductor memory portions and redundant memory portions for replacing malfunctioning normal memory cells are arranged in the form of a matrix on a semiconductor substrate. More specifically, the invention relates to a semiconductor memory device in which the semiconductor memory portion is equipped with a required number of redundant memory portions, and to a method of separating the semiconductor memory devices from the semiconductor wafer.

2. Description of the Related Art

In a semiconductor memory device such as dynamic random access memory (DRAM), in general, a redundant memory cell array and a fuse circuit for controlling redundancy are provided close to a normal memory cell array. In a device such as a DRAM or the like, when a memory cell malfunctions in the normal memory cell array, a line to which the memory cell is connected (i.e., a row line along the direction of word lines or a column line along the direction of bit lines) is replaced by a corresponding line in the redundant memory cell array by using a fuse circuit, in order to replace the normal memory cell that is malfunctioning.

In recent years, however, it has been attempted to further decrease the size of the semiconductor memory device (chip). As the size decreases, however, the ratio of areas occupied by the redundant memory cell array and the fuse circuit increases relative to the chip, serving as a principal factor which makes it difficult to decrease the chip size and to increase the degree of integration.

To cope with this, there has heretofore been employed a technology as disclosed in, for example, Japanese Unexamined Patent Publication (Kokai) No. 6-325589 according to which a fuse to be cut by a laser beam is arranged on a scribe line of a wafer, and another fuse to be melt-cut is arranged in a chip together with the redundant memory cell array. According to this technology, the fuse is cut by a laser beam to produce fuse information and a predetermined voltage is applied through a pad formed on the scribe line to trim the fuse for melt-cutting. In other words, the fuse to be cut by a laser beam is arranged outside the chip to decrease the area of the chip. However, this technology, too, imposes limitation on decreasing the size of the chip due to the presence of a redundant memory cell array in the chip.

Another technology has been disclosed in Japanese Unexamined Patent Publication (Kokai) No. 5-54695 according to which the redundant memory cells are so arranged that they will be shared by two memory cell array regions. In this technology, either one of the memory cell array regions is selected by using a switching element, and a defective memory cell in the selected memory cell array region is substituted with a redundant memory cell, in order to enhance the rate of relieving defective memory cells. However, this technology does not allow decreasing the chip size. That is, this technology cannot solve the problem of decreasing the chip size since the redundant memory cells are provided in the semiconductor memory device (chip).

As a further technology, Japanese Examined Patent Publication (Kokoku) No. 7-28012 discloses a semiconductor memory wherein redundant memory cell groups are arranged along the four sides of the normal memory cell group, in order to make uniform the shape of the memory cells in the normal memory cell group. According to this technology, the normal memory cell group is uniform in shape in order to decrease the chip size. Even with this technology, however, a limitation is imposed on decreasing the chip size, since the redundant memory cell groups are provided in the semiconductor memory (i.e., in the chip).

As a still further technology, Japanese Unexamined Patent Publication (Kokai) No. 6-5098 discloses a semiconductor memory device having a non-volatile redundant memory cell portion formed on a chip for recording inspection data during the inspection of the wafer. According to this technology, after the assembling is completed, the detailed electric characteristics are inspected and sorted based upon the inspection data in the redundant memory cell portion, so that the inspection and sorting can be easily accomplished without the need of writing data. However, the redundant memory cell portion used in this technology is not used to relieve the normal memory cell that is malfunctioning but is used to record the inspection data. Besides, this technology gives no consideration to decreasing the chip size.

SUMMARY OF THE INVENTION

A principal object of the present invention is to provide a semiconductor wafer and a semiconductor memory device which make it possible to further decrease the chip size and to efficiently relieve the malfunctioning memory cells relying upon a redundant memory portion.

Another object of the present invention is to provide a method of separating a semiconductor memory device, which further decreases the chip size, efficiently relieves the malfunctioning memory cells relying upon the redundant memory portion, and contributes to greatly increasing the number of the non-defective articles (semiconductor memory devices) obtained from the semiconductor wafers.

According to a first aspect of the present invention, there is provided a semiconductor wafer comprising a plurality of rectangular semiconductor memory portions arranged in the form of a matrix on a semiconductor substrate and each provided with a normal memory cell array, and a plurality of redundant memory portions each having a redundant memory cell array for relieving a malfunctioning memory cell that may exist in the normal memory cell array, wherein the plurality of redundant memory portions are sandwiched between the two neighboring semiconductor memory portions and are connected to the two semiconductor memory portions. Cutting lines are formed among the rectangular semiconductor memory portions and the redundant memory portions neighboring the semiconductor memory portions, so that the semiconductor memory portions can be separated from the semiconductor wafer in a subsequent stage in a manner in which the redundant memory portions are connected to the semiconductor memory portions as required.

According to a second aspect of the present invention, there is provided a semiconductor memory device comprising a rectangular semiconductor memory portion equipped with a normal memory cell array, and a redundant memory cell array for relieving a malfunctioning memory cell that may exist in the normal memory cell array, wherein at least one redundant memory portion is provided neighboring at least one side among the four sides of the rectangular semiconductor memory portion and being connected to the semiconductor memory portion.

According to a third aspect of the present invention, there is provided a method of separating a plurality of semiconductor memory devices, each including a semiconductor memory portion, from the semiconductor wafer, wherein either one of the cutting lines formed on both sides of the redundant memory portion is selected and is cut, so that the redundant memory portion remains connected to either one of the two semiconductor memory portions neighboring the redundant memory portion.

In separating a plurality of semiconductor memory devices from the semiconductor wafer according to a preferred embodiment, the cutting line is suitably selected and is cut in a manner such that the redundant memory portion equipped with a redundant memory cell array of redundant memory cells and having a function which substitutes for the function of the malfunctioning memory cell remains connected to the semiconductor memory portion neighboring the redundant memory portion when a malfunctioning memory cell exists in the normal memory cell array in the semiconductor memory portion.

According to the semiconductor wafer of the first aspect of the present invention, a redundant memory portion is sandwiched between the opposing sides of the two neighboring semiconductor memory portions among a plurality of rectangular semiconductor memory portions arranged in the form of a matrix, each redundant memory portion is connected to the two semiconductor memory portions, and cutting lines are formed between the semiconductor memory portions and the redundant memory portion neighboring the semiconductor memory portions. That is, the redundant memory portion is provided not in the semiconductor memory portion but between semiconductor memory portions, and is separated as a semiconductor memory device from the semiconductor wafer in a manner in which the redundant memory portion remains connected to the semiconductor memory portion as required. Therefore, the area of the semiconductor memory device (chip) is the sum of an area of the semiconductor memory portion and an area of a minimum of redundant memory portion that is required, making it possible to very efficiently decrease the chip size.

According to the semiconductor memory device of the second aspect of the present invention, the redundant memory portion is provided neighboring at least one side among the four sides of the rectangular semiconductor memory portion. In this case, only when there is a malfunctioning memory cell in the normal memory cell array in the semiconductor memory portion, is the redundant memory portion only connected to the semiconductor memory portion, the redundant memory portion being provided with a redundant memory cell array that works in place of the malfunctioning memory cell. Therefore, the area of the semiconductor memory device (chip) is the sum of the area of the semiconductor memory portion and the area of a minimum redundant memory portion that is required. This makes it possible to very efficiently decrease the chip size.

According to the method of separating the semiconductor memory devices of the third aspect of the present invention, furthermore, the cutting line is suitably selected and is cut so that the redundant memory portion equipped with the redundant memory cell array of redundant memory cells having a function which substitutes for the function of the malfunctioning memory cell remains connected to the semiconductor memory portion when there is a malfunctioning memory cell in the normal memory cell array in the semiconductor memory portion. Therefore, a semiconductor memory device is separated from the semiconductor wafer in a state where the redundant memory portion is connected to the semiconductor memory portion as required. Accordingly, the area of the separated semiconductor memory device (chip) is the sum of the area of the semiconductor memory portion and the area of a minimum redundant memory portion that is required, making it possible to very efficiently separate a chip having a minimum size.

DESCRIPTION OF THE PREFERRED EMBODIMENTS

Preferred embodiments of the present invention will now be described with reference to the drawings.

Figure 1:
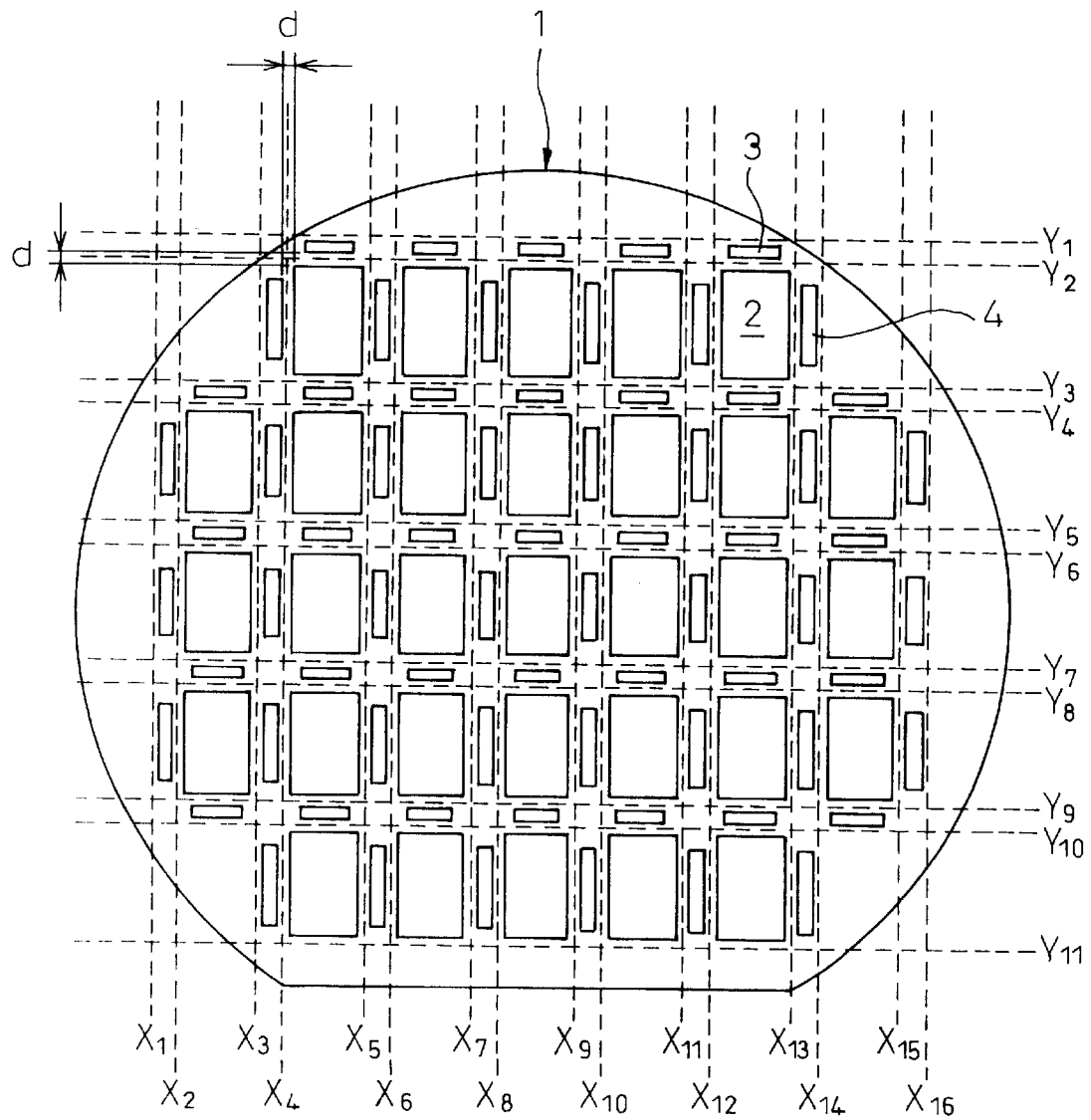
FIG. 1 is a plan view schematically illustrating the constitution of a semiconductor wafer according to an embodiment of the present invention.

FIG. 1 is a diagram schematically illustrating, in a plan view, the constitution of a semiconductor wafer according to an embodiment of the present invention.

In FIG. 1, reference numeral 1 denotes a semiconductor wafer on which are arranged, in the form of a matrix, a plurality of rectangular semiconductor memory portions 2 that are so designed as to realize desired functions. The semiconductor memory portion 2 includes a peripheral circuit such as an input/output interface circuit, a decoder circuit, an I/O control circuit, and the like. A redundant memory portion 3 or 4 is disposed neighboring each side of the rectangular semiconductor memory portion 2, the redundant memory portions 3 and 4 being connected to the neighboring semiconductor memory portions 2.

That is, the redundant memory portion 3 for relieving a malfunctioning memory cell in the semiconductor memory portion 2 in the column direction, is provided between the two semiconductor memory portions 2 that are neighboring each other in the up-and-down direction (i.e., in the column direction), and is, further, provided on the upper side of the semiconductor memory portions 2 arranged along the upper-most side on the semiconductor wafer 1. Similarly, the redundant memory portion 4 for relieving a malfunctioning memory cell in the semiconductor memory portion 2 in the row direction, is provided between the two semiconductor memory portions 2 that are neighboring each other in the right-and-left direction (i.g., in the row direction), and is further provided on the right side of the semiconductor memory portions 2 arranged on the right-most side on the semiconductor wafer 1 and is provided on the left side of the semiconductor memory portions 2 arranged on the left-most side on the semiconductor wafer 1.

As indicated by broken lines in FIG. 1, furthermore, cutting lines are formed among the semiconductor memory portions 2 and the redundant memory portions 3, 4, so that the semiconductor wafers 1 can be cut along such portions as required. In the diagramed example, cutting lines X1 to X16 are formed on both sides of the redundant memory portions 4 in the column direction, and cutting lines Y1 to Y11 are formed on both sides of the redundant memory portions 3 in the row direction.

In this embodiment, in view of the current technology to which the present invention pertains, a gap d between the rectangular semiconductor memory portions 2 and the neighboring redundant memory portions 3, 4 is selected over a range of from about 80 $\mu$m to about 120 $\mu$m. The cutting lines X1 to X16 and Y1 to Y11 formed in this gap d have a thickness of from about 30 $\mu$m to about 50 $\mu$m. Preferably, the gap d is set to be about 100 $\mu$m and the thickness of the cutting lines is set to be about 40 $\mu$m.

The semiconductor memory portions 2 are separated as "chips" from the semiconductor wafer 1 in a subsequent stage. The separation is accomplished by cutting the corresponding cutting lines in a manner in which a required number of redundant memory portions 3, 4 remain connected to the semiconductor memory portion 2, or in a manner in which the neighboring redundant memory portions 3, 4 are not connected when there is no malfunctioning memory cell in the semiconductor memory portion 2.

Figure 2:
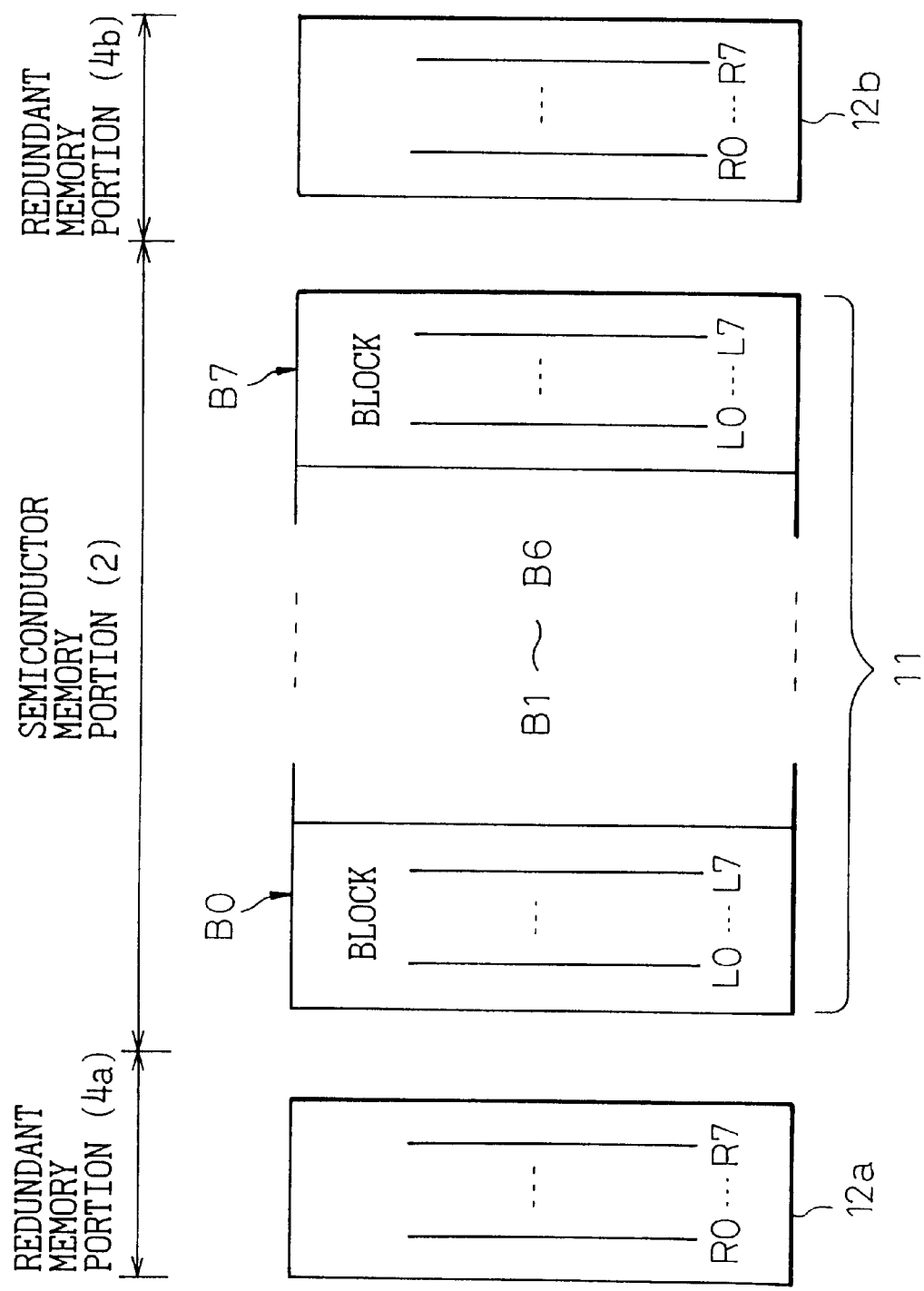
FIG. 2 is a diagram schematically illustrating the arrangement of the lines included in the memory cell arrays in the semiconductor memory portion and in the redundant memory portion.

FIG. 2 schematically illustrates the arrangement of lines included in the memory cell arrays of the semiconductor memory portion and of the redundant memory portion.

In FIG. 2, reference numeral 11 denotes a normal memory cell array included in the semiconductor memory portion 2, and 12a and 12b denote redundant memory cell arrays included in the redundant memory portions 4a and 4b neighboring the semiconductor memory portion 2. Referring to FIG. 2, the normal memory cell array 11 is constituted by a plurality of blocks B0 to B7 having first line groups L0 to L7 of which the lines are connected to the normal memory cells (not shown). On the other hand, the redundant memory cell arrays 12a, 12b have second line groups R0 to R7 of which the lines correspond to a plurality of blocks B0 to B7 and are connected to the redundant memory cells (not shown).

Based on this constitution, normally functioning lines are activated in the first line groups L0 to L7 included in the blocks B0 to B7 of the semiconductor memory portion 2, and lines in the second line groups R0 to R7 are inactivated in the redundant memory cell arrays 12a, 12b corresponding to a block that includes the above-mentioned lines. Any malfunctioning lines are inactivated, and the lines are activated in the second line groups R0 to R7 in the redundant memory cell arrays 12a, 12b corresponding to a block that includes the above-mentioned lines.

That is, a malfunctioning line present in the first line groups L0 to L7 of the blocks B0 to B7 constituting the normal memory cell array 11, is substituted by a corresponding line in the second line groups R0 to R7 in the redundant memory cell arrays 12a and 12b. In the arrangement shown in FIG. 2, the redundant memory portions 4a, 4b are arranged on both sides of the semiconductor memory portion 2. Therefore, even in case two lines (e.g., L0 and L7) become defective in the same block (e.g., B0) in the semiconductor memory portion 2, one line L0 is relieved by a corresponding line R0 in the redundant memory portion 4a of the left side and the other line L7 is relieved by a corresponding line R7 in the redundant memory portion 4b of the right side.

Figure 3:
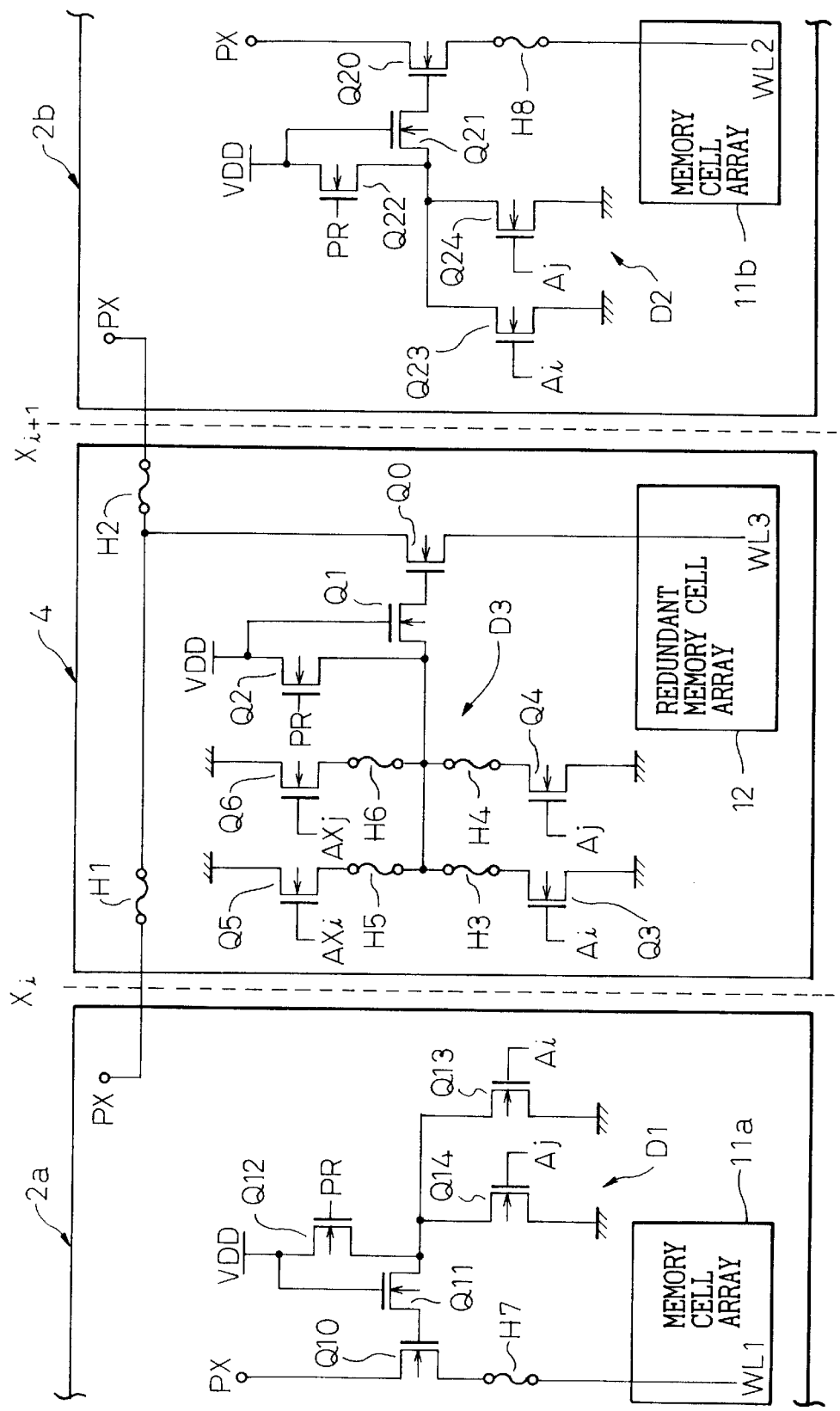
FIG. 3 is a circuit diagram schematically illustrating the structures in the redundant memory portion for relieving a malfunctioning line and in the semiconductor memory portion.

Described below with reference to FIG. 3 is a method of relieving the semiconductor memory portion in which a line (memory cell) is malfunctioning. Described below is the case where a word line in a particular block in the memory cell array in the semiconductor memory portion is substituted by a corresponding word line in the redundant memory portion in the row direction.

As shown, the semiconductor memory portions 2a and 2b neighboring the redundant memory portion 4 have normal decoders D1 and D2 for decoding digital address signals (two bits Ai and Aj in the diagramed embodiment), the normal decoders D1 and D2 being connected to the normal memory cell arrays 11a and 11b through the word lines WL1 and WL2. Similarly, the redundant memory portion 4 has a redundant decoder D3 for decoding digital address signals (two bits Ai, Aj and the logically inverted two bits AXi, AXj in the diagramed embodiment), the redundant decoder D3 being connected to the redundant memory cell array 12 through the word line WL3. The normal decoder D1(D2) is constituted by using MOS transistors Q10 to Q14 (Q20 to Q24), and the redundant decoder D3 is constituted by using MOS transistors Q0 to Q6.

The redundant decoder D3 is provided with fuses H1 and H2 at portions where a line (word line WL3) connected to the redundant memory cell in the redundant memory cell array 12 is connected to the neighboring semiconductor memory portions 2a and 2b on both sides, in order to cut these connections. The redundant decoder D3 is further provided with fuses H2, H3 and H4, H5 for cutting any of address signals Ai, Aj and AXi, AXj. The normal decoders D1, D2 are provided with fuses H7 and H8 for cutting the connections to the corresponding memory cell arrays 11a and 11b. In this embodiment, the fuses H1 to H8 are of the type that can be melted by a laser beam. Symbol VDD denotes a power-source voltage, PR denotes a precharging voltage, and PX denotes a pulse voltage signal.

To relieve, for example, the word line WL1 in the semiconductor memory portion 2a, the normal decoder D1 is substituted by the redundant decoder D3 as described below. That is, the fuse H7 is cut to inactivate the normal decoder D1, and any one of the fuses H1, H2 and H3 to H6 is cut to activate the redundant decoder D3. Through this operation, the logic of the redundant decoder D3 can be brought into agreement with the normal decoder D1. In this case, the cutting line Xi on the side of the semiconductor memory portion 2a is selected and is cut between the cutting lines Xi and Xi+1 formed among the redundant memory portion 4 and the semiconductor memory portions 2a, 2b on both sides.

In the foregoing was described the case of relief in the row direction. However, the relief can be effected in the same manner in the column direction.

Figure 4:
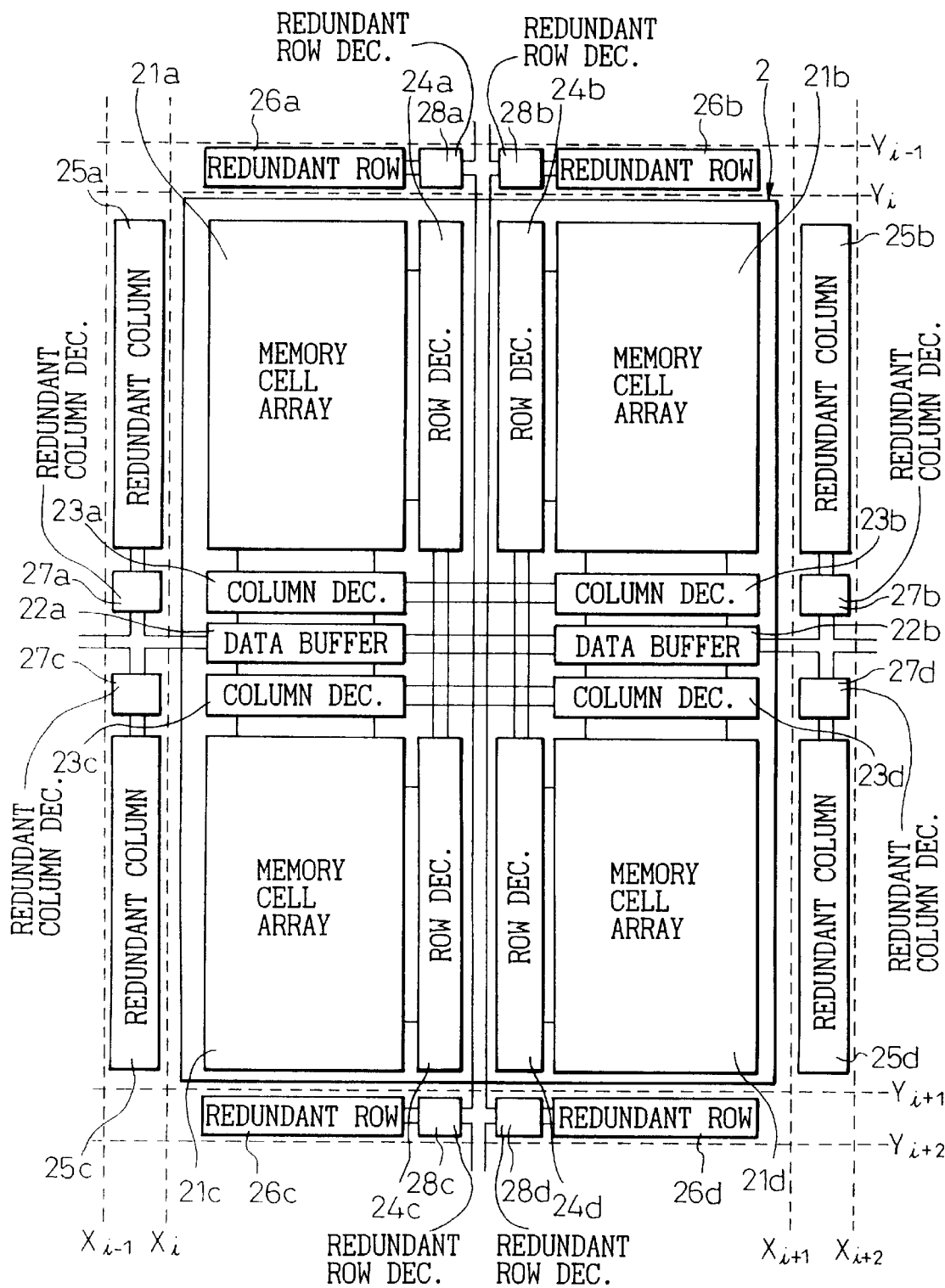
FIG. 4 is a block diagram concretely illustrating a structure of the semiconductor memory portion neighboring the redundant memory portion.
Figure 5A:
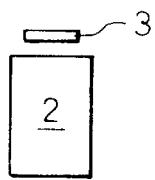
FIGS. 5a to 5k, 5m, 5n and 5p to 5r are diagrams schematically illustrating various semiconductor memory devices obtained according to the method of separation of the present invention.
Figure 5B:
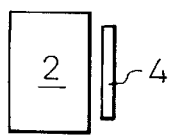
Figure 5C:
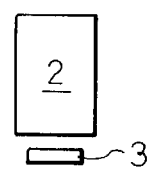
Figure 5D:
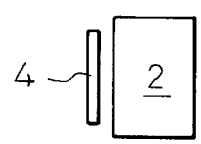
Figure 5E:
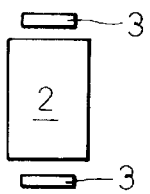
Figure 5F:
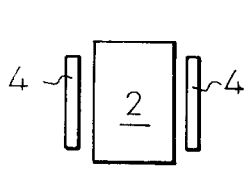
Figure 5G:
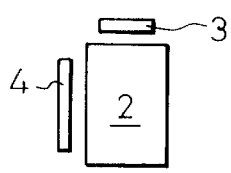
Figure 5H:
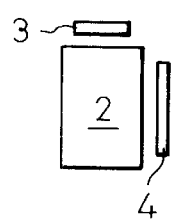
Figure 5I:
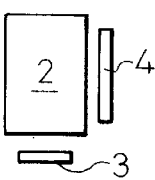
Figure 5J:
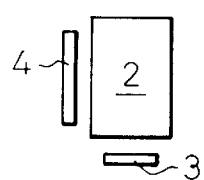
Figure 5K:
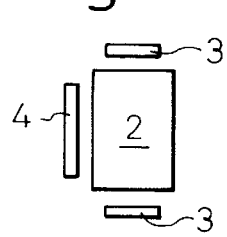
Figure 5M:
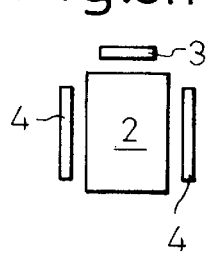
Figure 5N:
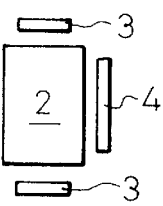
Figure 5P:
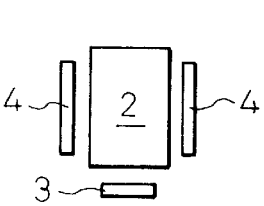
Figure 5Q:
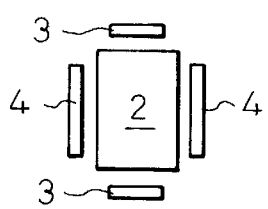
Figure 5R:
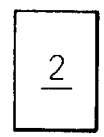

Next, described below with reference to FIG. 4 is a method of relieving a semiconductor memory portion in which a memory cell is malfunctioning in the row direction and in the column direction. Described below is the case where the semiconductor memory portion 2 is divided into four blocks.

As shown, each block has a memory cell array 21a (21b to 21d) and peripheral circuits, i.e., a row decoder 24a (24b to 24d) and a column decoder 23a (23b to 23d). Data buffers 22a and 22b are provided in a manner of being shared by the two blocks. Four redundant memory portions are arranged neighboring the sides of the semiconductor memory portion 2 which consists of four blocks. A redundant memory portion neighboring the upper side of the semiconductor memory portion 2 has redundant rows 26a, 26b and redundant row decoders 28a, 28b corresponding to the memory cell arrays 21a, 21b, a redundant memory portion neighboring the left side has redundant columns 25a, 25c and redundant column decoders 27a, 27c corresponding to the memory cell arrays 21a, 21c, a redundant memory portion neighboring the right side has redundant columns 25b, 25d and redundant column decoders 27b, 27d corresponding to the memory cell arrays 21b, 21d, and a redundant memory portion neighboring the lower side has redundant rows 26c, 26d and redundant row decoders 28c, 28d corresponding to the memory cell arrays 21c, 21d.

In this embodiment, when the memory cell array 21a contains a defective column, the fuse (not shown) in the redundant column decoder 27a is cut and is made redundant to be substituted by part of the column decoder 23a. When the number of the defective columns is small, the redundant column decoder 27a and the redundant column 25a are used. When the number of the defective columns is large, the redundant column decoder 27c and the redundant column 25c are used, as well.

Similarly, when the memory cell array 21c contains a defective column, the redundant column decoder 27c and the redundant column 25c are used. When the number of the defective columns is large, the redundant column decoder 27a and the redundant column 25a are used, as well. Similarly, when the memory cell array 21b contains a defective column, the redundant column decoder 27b and the redundant column 25b are used. When the number of the defective columns is large, the redundant column decoder 27d and the redundant column 25d are used, as well. Similarly, when the memory cell array 21d contains a defective column, the redundant column decoder 27d and the redundant column 25d are used. When the number of the defective columns is large, the redundant column decoder 27b and the redundant column 25b are used, as well.

In the foregoing was described the case of relief in the column direction. The relief, however, can be effected in the same manner in the row direction.

Next, described below is the method of separating the semiconductor memory devices from the semiconductor wafer 1.

First, malfunctioning cells are specified in all of the semiconductor memory portions 2 through a predetermined inspection. From a relationship among the specified result, numbers and positions of the malfunctioning cells, and the neighboring redundant memory portions 3 and 4, either one of the cutting lines formed on both sides of the redundant memory portions 3, 4 is selected and is cut such that the number of the semiconductor memory portions 2 that can be relieved becomes a maximum.

The semiconductor memory devices (chips) can be separated from the semiconductor wafer 1 in a total of sixteen different ways depending upon the manner of cutting the lines X1 to X16 and Y1 to Y11 (see FIG. 1) as schematically shown in FIGS. 5a to 5k, 5m, 5n and 5p to 5r.

According to this embodiment as described above, the redundant memory portions 3, 4 are not provided in the semiconductor memory portions 2 but are provided between the semiconductor memory portions 2, and the semiconductor wafer 1 is separated into semiconductor memory devices in a state where the redundant memory portions 3, 4 remain connected to the semiconductor memory portion 2 as required. Therefore, the area of the semiconductor memory device (chip) after being separated is the sum of the area of the semiconductor memory portion 2 and the areas of minimum redundant memory portions 3, 4 that are required. Thus, the area of the semiconductor memory device is very efficiently decreased.

Moreover, the semiconductor memory devices are separated from the semiconductor wafer 1 in a manner that the number of the semiconductor memory portions 2 that can be relieved becomes a maximum. It is therefore possible to greatly increase the number of the non-defective semiconductor memory devices (chips) that are obtained from the semiconductor wafer 1.

The foregoing embodiment has dealt with the case where the semiconductor memory portion has a rectangular shape. Not being limited thereto only, however, the semiconductor memory portion may assume a polygonal shape, a circular shape or an oval shape. Examples of the polygonal shape include a triangular shape, a pentagonal shape, a hexagonal shape, etc. When the semiconductor memory portion is of a circular shape or an oval shape, a group of lines for connection to the redundant memory cell array is formed in the periphery of the semiconductor memory portion, a redundant memory cell array is provided being connected to the semiconductor memory portion via said group of lines neighboring at least part of the peripheral regions of the semiconductor memory portion, and groups of lines formed in at least other parts of the peripheral regions of the semiconductor memory portion remain as groups of lines that are not connected to the redundant memory cell array.

What is claimed is:

1. A semiconductor wafer comprising:
   a plurality of polygonal semiconductor memory portions arranged in the form of a matrix on a semiconductor substrate and each provided with a normal memory cell array; and
   a plurality of redundant memory portions each having a redundant memory cell array for relieving a malfunctioning memory cell that may exist in said normal memory cell array;
   said plurality of redundant memory portions being sandwiched between the two neighboring semiconductor memory portions and are connected to said two semiconductor memory portions; and
   cutting lines are formed among said semiconductor memory portions and the redundant memory portion neighboring said semiconductor memory portions, so that the semiconductor devices can be separated from the semiconductor wafer in a subsequent stage in a manner in which the redundant memory portions are connected to the semiconductor memory portions as required.

2. The semiconductor wafer according to claim 1, wherein:
   said normal memory cell array is constituted by a plurality of blocks having first line groups connected to the normal memory cells;
   said redundant memory cell array has second line groups corresponding to said plurality of blocks and are connected to the redundant memory cells; and
   when a malfunctioning line exists in said first line groups, a corresponding line in said second line groups that is to be made redundant is activated to substitute for said malfunctioning line.

3. The semiconductor wafer according to claim 2, wherein:
   a first fuse is provided for each of said first line groups in each of the plurality of blocks constituting said normal memory cell array;
   a second fuse is provided for each of said second line groups included in said redundant memory cell array; and when a malfunctioning line exists in said first line groups, said first fuse corresponding to said malfunctioning line is cut, and said second fuse is cut so that a corresponding line in said second line groups to be made redundant is-activated to substitute for said malfunctioning line.

4. The semiconductor wafer according to claim 2, wherein, in a portion where the first and second redundant memory portions are arranged neighboring the opposing sides of a semiconductor memory portion;

a corresponding line is activated in said second line groups included in the redundant memory cell array of either said first redundant memory portion or said second redundant memory portion when there is a malfunctioning line in said first line groups in each of a plurality of blocks constituting the normal memory cell array of said one semiconductor memory portion, and a corresponding line is activated in said second line groups included in the redundant memory cell arrays of both said first redundant memory portion and said second redundant memory portion when there are two malfunctioning lines in said first line groups.

5. The semiconductor wafer according to claim 2, wherein said first line groups are constituted by column lines along the direction of bit lines in said normal memory cell array, and said second line groups are constituted by corresponding redundant column lines in said redundant memory cell array.

6. The semiconductor wafer according to claim 2, wherein said first line groups are constituted by row lines along the direction of word lines in said normal memory cell array, and said second line groups are constituted by corresponding row lines in said redundant memory cell array.

7. The semiconductor wafer according to claim 1, wherein said plurality of redundant memory portions are arranged neighboring part of the peripheral regions of the semiconductor memory portion and are connected to said semiconductor memory portion.

8. The semiconductor wafer according to claim 1, wherein a gap among said semiconductor memory portions and said redundant memory portions neighboring said semiconductor memory portions, is selected to lie over a range of from about 80 $\mu$m to about 120 $\mu$m.

9. The semiconductor wafer according to claim 8, wherein said cutting lines have a thickness of from about 30 $\mu$m to about 50 $\mu$m.

10. The semiconductor wafer according to claim 9, wherein said gap is preferably selected to be about 100 $\mu$m, and the thickness of said cutting lines is preferably selected to be about 40 $\mu$m.

11. The semiconductor wafer according to claim 1, wherein said semiconductor memory portion comprises a peripheral circuit portion, said peripheral circuit portion including an input/output interface circuit, a decoder circuit and an I/O control circuit.

12. A semiconductor memory device comprising:

a polygonal semiconductor memory portion equipped with a normal memory cell array;

a redundant memory cell array for relieving a malfunctioning memory cell that may exist in said normal memory cell array; and line groups provided for the sides of said semiconductor memory portion of said polygonal shape and are capable of being connected to said redundant memory cell array;

wherein said redundant memory cell array neighbors, but is physically separated from, at least one first side of said semiconductor memory portion of said polygonal shape and is connected to said semiconductor memory portion through a corresponding one of said line groups; and wherein said line groups provided for a second side, which is not among said at least one first side of said semiconductor memory portion of said polygonal shape, is not connected to said redundant memory cell array.

13. The semiconductor memory device according to claim 12, wherein said polygonal shape is a rectangular shape.

14. The semiconductor memory device according to claim 12, wherein said semiconductor memory portion comprises a peripheral circuit portion, said peripheral circuit portion including an input/output interface circuit, a decoder circuit and an I/O control circuit.

15. A semiconductor memory device comprising:

a semiconductor memory portion equipped with a normal memory cell array;

a redundant memory cell array for relieving a malfunctioning memory cell that may exist in said normal memory cell array; and line groups provided in the peripheral regions of said semiconductor memory portion and capable of being connected to said redundant memory cell array;

wherein said redundant memory cell array neighbors, but is physically separated from, at least one portion of said peripheral regions of said semiconductor memory portion and is connected to said semiconductor memory portion through a corresponding one of said line groups; and wherein one of said line groups provided in at least other portions, of said peripheral region which are not said at least one portion of said peripheral regions of said semiconductor memory portion, is not connected to said redundant memory cell array.

16. The semiconductor memory device according to claim 15, wherein:

said normal memory cell array is constituted by a plurality of blocks having first line groups connected to the normal memory cells;

said redundant memory cell array has second line groups corresponding to said plurality of blocks and are connected to the redundant memory cells; and a malfunctioning line is inactivated in said first line groups, and a line in said second line groups corresponding to a block including said malfunctioning line is activated.

17. The semiconductor memory device according to claim 16, wherein:

a first fuse is provided for each of said first line groups in each of the plurality of blocks constituting said normal memory cell array;

a second fuse is provided for each of said second line groups included in said redundant memory cell array; and when a malfunctioning line exists in said first line groups, said first fuse corresponding to said malfunctioning line is cut, and said second fuse is cut so that a corresponding line in said second line groups to be made redundant is activated to substitute for said malfunctioning line.

18. The semiconductor memory device according to claim 16, wherein:

the first redundant memory portion and the second redundant memory portion are connected neighboring the first portion and the second portion of said peripheral regions of said semiconductor memory portion; and a corresponding line is activated in said second line groups included in the redundant memory cell array of either said first redundant memory portion or said second redundant memory portion when there is a malfunctioning line in said first line groups in each of a plurality of blocks constituting the normal memory cell array of said semiconductor memory portion, and a corresponding line is activated in said second line groups included in the redundant memory cell arrays of both said first redundant memory portion and said second redundant memory portion when there are two malfunctioning lines in said first line groups.

19. The semiconductor memory device according to claim 15, wherein said semiconductor memory portion comprises a peripheral circuit portion, said peripheral circuit portion including an input/output interface circuit, a decoder circuit and an I/O control circuit.

20. A semiconductor memory device comprising:

a polygonal semiconductor memory portion equipped with a normal memory cell array;

a redundant memory cell array for relieving a malfunctioning memory cell that may exist in said normal memory cell array; and line groups provided for the sides of said semiconductor memory portion of said polygonal shape and are capable of being connected to said redundant memory cell array;

wherein said redundant memory cell array neighbors at least one side of said semiconductor memory portion of said polygonal shape and is connected to said semiconductor memory portion through a corresponding line group; and a gap between said semiconductor memory portion and said neighboring redundant memory cell array is selected to be from about 80 $\mu$m to about 120 $\mu$m.

21. The semiconductor memory device according to claim 20, wherein said polygonal shape is a rectangular shape.

22. The semiconductor memory device according to claim 20, wherein:

said normal memory cell array is constituted by a plurality of blocks having first line groups connected to the normal memory cells;

said redundant memory cell array has second line groups corresponding to said plurality of blocks and connected to the redundant memory cells; and a malfunctioning line is inactivated in said first line groups, and a line in said second line groups corresponding to a block including said malfunctioning line is activated.

23. The semiconductor memory device according to claim 22, wherein:

a first fuse is provided for each of said first line groups in each of the plurality of blocks constituting said normal memory cell array;

a second fuse is provided for each of said second line groups included in said redundant memory cell array; and when a malfunctioning line exists in said first line groups, said first fuse corresponding to said malfunctioning line is cut, and said second fuse is cut so that a corresponding line in said second line groups to be made redundant is activated to substitute for said malfunctioning line.

24. The semiconductor memory device according to claim 22, wherein:

the first redundant memory portion and the second redundant memory portion are connected neighboring the first side and the second side of said semiconductor memory portion of said polygonal shape; and a corresponding line is activated in said second line groups included in the redundant memory cell array of either said first redundant memory portion or said second redundant memory portion when there is a malfunctioning line in said first line groups in each of a plurality of blocks constituting the normal memory cell array of said semiconductor memory portion, and a corresponding line is activated in said second line groups included in the redundant memory cell arrays of both said first redundant memory portion and said second redundant memory portion when there are two malfunctioning lines in said first line groups.

25. The semiconductor memory device according to claim 20, wherein said semiconductor memory portion comprises a peripheral circuit portion, said peripheral circuit portion including an input/output interface circuit, a decoder circuit and an I/O control circuit.

26. A semiconductor memory device comprising:

a semiconductor memory portion equipped with a normal memory cell array;

a redundant memory cell array for relieving a malfunctioning memory cell that may exist in said normal memory cell array; and line groups provided in the peripheral regions of said semiconductor memory portion and are capable of being connected to said redundant memory cell array;

wherein said redundant memory cell array neighbors at least one portion of said peripheral regions of said semiconductor memory portion and is connected to said semiconductor memory portion through a corresponding line group; and a gap between said semiconductor memory portion and said neighboring redundant memory cell array is selected to be from about 80 $\mu$m to about 120 $\mu$m.

27. The semiconductor memory device according to claim 26, wherein:

said normal memory cell array is constituted by a plurality of blocks having first line groups connected to the normal memory cells;

said redundant memory cell array has second line groups corresponding to said plurality of blocks and are connected to the redundant memory cells; and a malfunctioning line is inactivated in said first line groups, and a line in said second line groups corresponding to a block including said malfunctioning line is activated.

28. The semiconductor memory device according to claim 27, wherein:

a first fuse is provided for each of said first line groups in each of the plurality of blocks constituting said normal memory cell array;

a second fuse is provided for each of said second line groups included in said redundant memory cell array; and when a malfunctioning line exists in said first line groups, said first fuse corresponding to said malfunctioning line is cut, and said second fuse is cut so that a corresponding line in said second line groups to be made redundant is activated to substitute for said malfunctioning line.

29. The semiconductor memory device according to claim 27, wherein:

the first redundant memory portion and the second redundant memory portion are connected neighboring the first portion and the second portion of said peripheral regions of said semiconductor memory portion; and a corresponding line is activated in said second line groups included in the redundant memory cell array of either said first redundant memory portion or said second redundant memory portion when there is a malfunctioning line in said first line groups in each of a plurality of blocks constituting the normal memory cell array of said semiconductor memory portion, and a corresponding line is activated in said second line groups included in the redundant memory cell arrays of both said first redundant memory portion and said second redundant memory portion when there are two malfunctioning lines in said first line groups.

30. The semiconductor memory device according to claim 26, wherein said semiconductor memory portion comprises a peripheral circuit portion, said peripheral circuit portion including an input/output interface circuit, a decoder circuit and an I/O control circuit.

31. A semiconductor memory device comprising:

a semiconductor memory portion equipped with a normal memory cell array; and line groups provided in the peripheral regions of said semiconductor memory portion and capable of being connected to redundant memory cell arrays, said redundant memory cell array separated from said memory portion by a gap;

wherein at least some line groups among said line groups are not connected to the redundant memory cell arrays.

32. The semiconductor memory device according to claim 31, wherein said semiconductor memory portion comprises a peripheral circuit portion, said peripheral circuit portion including an input/output interface circuit, a decoder circuit and an I/O control circuit.

33. A semiconductor memory device comprising:

a polygonal semiconductor memory portion equipped with a normal memory cell array; and line groups provided for the sides of said semiconductor memory portion of said polygonal shape and are capable of being connected to redundant memory cell arrays, said redundant memory cell array being separated from said memory portion by a gap.

34. A semiconductor memory device according to claim 33, wherein said polygonal shape is a rectangular shape.

35. The semiconductor memory device according to claim 33, wherein said semiconductor memory portion comprises a peripheral circuit portion, said peripheral circuit portion including an input/output interface circuit, a decoder circuit and an I/O control circuit.

36. A semiconductor memory device comprising:

a semiconductor memory portion equipped with a normal memory cell array;

a redundant memory cell array for relieving a malfunctioning memory cell that may exist in said normal memory cell array; and line groups provided in the peripheral regions of said semiconductor memory portion and are capable of being connected to said redundant memory cell array;

wherein said redundant memory cell array neighbors at least one portion of said peripheral regions of said semiconductor memory portion and is connected to said semiconductor memory portion through a corresponding line group; and a gap between said semiconductor memory portion and said neighboring redundant memory cell array is selected to be greater than the width of a cutting line used to separate said device from a wafer during manufacture of said device.

37. A semiconductor memory device comprising:

a semiconductor memory portion equipped with a normal memory cell array;

a redundant memory cell array for relieving a malfunctioning memory cell that may exist in said normal memory cell array; and line groups provided in the peripheral regions of said semiconductor memory portion and are capable of being connected to said redundant memory cell array;

wherein said redundant memory cell array neighbors at least one portion of said peripheral regions of said semiconductor memory portion and is connected to said semiconductor memory portion through a corresponding line group; and a gap between said semiconductor memory portion and said neighboring redundant memory cell array includes a cutting line used to separate said device from a wafer during manufacture of said device.

38. A semiconductor wafer comprising:

a plurality of polygonal semiconductor memory portions arranged in the form of a matrix on a semiconductor substrate and each provided with a normal memory cell array; and a plurality of redundant memory portions each having a redundant memory cell array for relieving a malfunctioning memory cell that may exist in said normal memory cell array;

said plurality of redundant memory portions being sandwiched between the two neighboring semiconductor memory portions and are connectable to said two semiconductor memory portions; and cutting lines are formed among said semiconductor memory portions and the redundant memory portion neighboring said semiconductor memory portions, so that the semiconductor devices can be separated from the semiconductor wafer in a subsequent stage in a manner in which the redundant memory portions are connected to the semiconductor memory portions as required;

said semiconductor memory portions and the redundant memory portions neighboring said semiconductor memory portions being separated by greater than the width of a cutting line so that the semiconductor devices can be separated from the semiconductor wafer in a subsequent stage in a manner in which the redundant memory portions are connected to the semiconductor portions as required.

39. A semiconductor chip comprising:

a semiconductor memory portion including a normal memory cell array;

line groups provided for each side of said memory portion;

at least one redundant memory cell array neighboring at least one side of said memory portion; and a gap between said memory portion and said at least one redundant memory cell array;

wherein at least one redundant memory cell in each said redundant memory cell array relieves a malfunctioning memory cell in said normal memory cell array and is connected to said memory portion via a corresponding one of said line groups, whereby an area occupied by said redundant memory cell array relative to said normal memory cell array is minimized.

* * * * *